(12) United States Patent
Soltanpur et al.

(10) Patent No.: US 11,201,639 B2
(45) Date of Patent: *Dec. 14, 2021

(54) INSTRUMENTS AND METHODS OF DETECTING INTERMITTENT NOISE IN A CABLE NETWORK SYSTEM

(71) Applicant: VIAVI SOLUTIONS INC., San Jose, CA (US)

(72) Inventors: Cinna Soltanpur, San Jose, CA (US); Brian Swanson, Fishers, IN (US)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/919,501

(22) Filed: Jul. 2, 2020

(65) Prior Publication Data

US 2021/0083719 A1 Mar. 18, 2021

Related U.S. Application Data

(63) Continuation of application No. 16/408,462, filed on May 9, 2019, now Pat. No. 10,715,212.

(60) Provisional application No. 62/669,556, filed on May 10, 2018.

(51) Int. Cl.
*H04B 17/00* (2015.01)
*H04B 3/46* (2015.01)
*H04L 12/26* (2006.01)
*G01R 31/08* (2020.01)

(52) U.S. Cl.
CPC .............. *H04B 3/46* (2013.01); *G01R 31/086* (2013.01); *H04L 43/50* (2013.01)

(58) Field of Classification Search
CPC ... H04L 1/20; H04L 43/50; H04L 1/24; H04L 1/1027; H04L 41/142; H04B 17/006; H04B 17/309; H04B 17/00; H04B 3/46
USPC .................................................. 375/227, 222
See application file for complete search history.

(56) References Cited

U.S. PATENT DOCUMENTS

| 10,715,212 B2 * | 7/2020 | Soltanpur | ............ G01R 31/086 |
| 2017/0019664 A1 | 1/2017 | Chappell | |
| 2019/0075038 A1 | 3/2019 | Gotwals | |
| 2019/0319718 A1* | 10/2019 | Williams | ............... H04H 20/77 |

* cited by examiner

*Primary Examiner* — Khai Tran
(74) *Attorney, Agent, or Firm* — DLA Piper LLP (US)

(57) ABSTRACT

Cable network test instruments are disclosed. The test instruments are configured to collect signal data at a node from a cable network system and analyze the collected data to determine whether intermittent noise is present. Methods of locating intermittent noise are also disclosed.

20 Claims, 10 Drawing Sheets

INSTRUMENTS AND METHODS OF DETECTING INTERMITTENT NOISE IN A CABLE NETWORK SYSTEM

CROSS-REFERENCE TO RELATED APPLICATION

This application is a continuation of U.S. application Ser. No. 16/408,462 filed May 9, 2019, which claims the benefit of U.S. Provisional Patent Application No. 62/669,556, filed May 10, 2018, the entire disclosures of which are incorporated by reference herein.

TECHNICAL FIELD

The present disclosure relates, generally, to data-over-cable or cable network system testing and, more particularly, to instruments and methods for testing of an upstream or return signal path of a cable network system.

BACKGROUND

Most cable network systems are coaxial-based broadband access systems that may take the form of all-coax network systems, hybrid fiber coax (HFC) network systems, or RF over glass (RFOG) network systems. Cable network system designs, including, for example, cable television (CATV) network system designs, typically use a tree-and-branch architecture that permits bi-directional data transmission, including Internet Protocol (IP) traffic between the cable system head-end and customer locations. There is a forward or downstream signal path (from the cable system head-end to the customer location) and a return or upstream signal path (from the customer location back to the cable system head-end). The upstream and the downstream signals occupy separate frequency bands. In the United States, the frequency range of the upstream band is from 5 MHz to 42 MHz, 5 MHz to 65 MHz, 5 MHz to 85 MHz, or 5 MHz to 200 MHz, while the downstream frequency band is positioned in a range above the upstream frequency band.

Customer locations may include, for example, cable network subscriber's premises. Typical signals coming from a subscriber's premises include, for example, set top box DVR/On Demand requests, test equipment data channels, and Internet Protocol output cable modem carriers defined by the Data Over Cable Service Interface Specification ("DOCSIS"), which is one communication standard for bidirectional data transport over a cable network system.

Because the subscriber's premises is not the property of the cable network operator and signals from many subscribers' premises on a particular node combine in the return band, the return path/upstream band of the cable network system is subject to significant noise, with every subscriber's premises acting like an antenna. Noise (ingress) that intrudes into the upstream band, which is typically called ingress, accumulates along the tree-and-branch architecture, as in a funnel, until it reaches the cable head-end. Sources of ingress include short wave radio signals, broadband noise generated by, for example, personal computers and electric motors, and intermittent noise, including impulse noise, which are very short bursts of broadband noise (e.g., ranging in duration of one nanosecond to a few tens of microseconds).

Technicians have typically used signal level meters to measure ingress. This is usually done by physically connecting the signal level meter to a test point in the CATV system and using spectral analysis and/or heat maps to locate noise in the return band spectrum.

SUMMARY

According to one aspect, a cable network test instrument is disclosed. The test instrument is configured to be coupled to a cable network system at one of a plurality of nodes of the system. The test instrument is operable to collect signal data at a node. The test instrument is also configured to analyze the collected data to determine whether intermittent noise is present at the node. A method of locating intermittent noise is also disclosed.

According to another aspect, the cable network test instrument comprises a port configured to be coupled to a node of a cable network system, and a controller electrically connected to the port that is configured to access data on the cable network system via the port. The controller includes circuitry configured to locate configuration messages related to an upstream band in data received from the cable network system, identify at least one time period in which no carriers are present in the upstream band based on at least one configuration message, collect signal data from the cable network system during the at least one identified time period, and analyze the collected data to determine whether intermittent noise is present at the node.

In some embodiments, the cable network test instrument may further comprise a display operable to visually indicate intermittent noise present at the node. Additionally, in some embodiments, the circuitry of the controller may be configured to operate the display to provide a visual indication of a location of intermittent noise.

In some embodiments, the circuitry of the controller may be configured to operate the display to provide a first visual indicator when the location of intermittent noise is downstream from the node and to provide a second visual indicator when the location of intermittent noise is upstream from the node.

In some embodiments, the configuration messages related to the upstream band may include the upstream channel descriptors transmitted by the cable network system.

In some embodiments, the circuitry of the controller may be configured to perform a statistical analysis to analyze the collected data to determine whether intermittent noise is present at the node. Additionally, in some embodiments, the statistical analysis may include identifying signals with a low standard of deviation and a high average as intermittent noise. The statistical analysis may include identifying signals with a high standard of deviation and a low average as a portion of a noise floor of the cable network system.

In some embodiments, the circuitry of the controller may be configured to perform a peak-hold analysis to analyze the collected data to determine whether intermittent noise is present at the node.

According to another aspect, a method for locating intermittent noise in a cable network system comprises operating a test instrument at a first node of the cable network system to locate configuration messages related to an upstream band of the cable network system, identifying, with the test instrument, at least one time period in which no carriers are present in the upstream band based on at least one configuration message, collecting at the first node, with the test instrument, signal data from the cable network system during the at least one identified time period, and analyzing, with the test instrument, the collected data to determine whether intermittent noise is present at the first node.

In some embodiments, the method may further comprise moving to a second node based on whether intermittent noise is present at the first node, operating the test instrument at the second node of the cable network system to locate configuration messages related to the upstream band of the cable network system, identifying, with the test instrument, at least one time period in which no carriers are present in the upstream band based on at least one configuration message, collecting at the second node, with the test instrument, signal data from the cable network system during the at least one identified time period, and analyzing, with the test instrument, the collected data to determine whether intermittent noise is present at the second node.

In some embodiments, the method may further comprise determining that an intermittent noise source is located between the first node and the second node when intermittent noise is not detected at the second node. Additionally, in some embodiments, the method may comprise determining that an intermittent noise source is downstream of the first node when intermittent noise is detected at the first node. The method may further comprise determining that an intermittent noise source is upstream of the first node when intermittent noise is not detected at the first node.

In some embodiments, the step of analyzing the collected data to determine whether intermittent noise is present at the first node may comprise performing, with the test instrument, a statistical analysis of the collected data. Additionally, in some embodiments, performing the statistical analysis of the collected data may include identifying signals with a low standard of deviation and a high average as intermittent noise. In some embodiments, performing the statistical analysis of the collected data may include identifying signals with a high standard of deviation and a low average as a portion of a noise floor of the cable network system.

In some embodiments, the step of analyzing the collected data to determine whether intermittent noise is present at the first node may comprise performing a peak-hold analysis of the collected data.

In some embodiments, the at least one configuration message may include an upstream channel descriptor.

According to another aspect, a cable network test instrument comprises a port configured to be coupled to a node of a cable network system, and a controller electrically connected to the port that is configured to communicate with the cable network system via the port. The controller includes circuitry configured to request an extended modem register period from the cable network system, collect signal data from the cable network system during the extended modem register period, and analyze the collected data to determine whether intermittent noise is present at the node.

In some embodiments, the port may be a wireless transceiver operable to communicate wirelessly with the node of the cable network system.

According to another aspect, a method for locating intermittent noise in a cable network system comprises operating a test instrument at a first node of the cable network system to identify, with the test instrument, at least one time period in which no carriers are present in an upstream band, collecting at the first node, with the test instrument, signal data from the cable network system during the at least one identified time period, and analyzing, with the test instrument, the collected data to determine whether intermittent noise is present at the first node.

In some embodiments, the method may further comprise moving to a second node based on whether intermittent noise is present at the first node, operating the test instrument at the second node to identify at least one time period in which no carriers are present in the upstream band, collecting at the second node, with the test instrument, signal data from the cable network system during the at least one identified time period, and analyzing, with the test instrument, the collected data to determine whether intermittent noise is present at the second node.

According to another aspect, a cable network test instrument comprises a port configured to be coupled to a node of a cable network system, and a controller electrically connected to the port. The controller is configured to access data on the cable network system via the port and includes circuitry configured to collect signal data from the cable network system when the port is coupled to the node, identify an upper boundary of a background noise floor in the collected signal data across a predetermined frequency range of the cable network system, and generate a plurality of signal traces based on the collected signal data. The circuitry is also configured to create a carrier reference profile based on signal amplitudes in the collected signal data that exceed the upper boundary of the background noise floor, isolate a number of signal traces in the plurality of signal traces based on the carrier reference profile and the upper boundary of the background noise floor, and generate an output signal based on the number of isolated signal traces for a user to determine whether intermittent noise is present.

In some embodiments, the circuitry configured to isolate a number of signal traces in the plurality of signal traces may comprise circuitry configured to identify a plurality of signal amplitudes present in the plurality of signal traces that are less than the upper boundary of the background noise floor. Additionally, in some embodiments, the circuitry configured to isolate a number of signal traces in the plurality of signal traces further may comprise circuitry configured to cross-correlate each signal trace of the plurality of signal traces with the carrier reference profile, compare each cross-correlation to a predetermined threshold, and identify each signal trace as including a carrier when the cross-correlation associated exceeds the predetermined threshold.

In some embodiments, the circuitry configured to generate the output signal based on the number of isolated signal traces may comprise circuitry configured to collect the number of isolated signal traces, and generate an intermittent noise trace based on a maximum signal amplitude present at each frequency in the number of isolated signal traces. The intermittent noise trace may include a plurality of signal amplitudes across the predetermined frequency range.

Additionally, in some embodiments, the cable network test instrument may comprise a visual display. The circuitry configured to generate the output signal based on the number of isolated signal traces may further comprise circuitry configured to operate the visual display to show the intermittent noise trace.

In some embodiments, the circuitry configured to identify the upper boundary of the background noise floor in the collected signal data across the predetermined frequency range of the cable network system may comprise circuitry configured to separate the predetermined frequency range into a plurality of frequency bins. Each frequency bin may include a portion of the predetermined frequency range. The circuitry may also be configured to generate a histogram of signal amplitudes based on the collected signal data for each frequency bin, identify, for each frequency bin, a minimum peak signal amplitude having the highest probability in the histogram, follow a slope of the bars of the histogram from the identified minimum peak signal amplitude to a minimum signal amplitude for each frequency bin, and identify the minimum signal amplitudes for the frequency bins as the upper boundary of the background noise floor for the predetermined frequency range.

In some embodiments, each signal trace may include a plurality of signal amplitudes, and the circuitry configured to create the carrier reference profile may comprise circuitry configured to compare the plurality of signal amplitudes in each signal trace of the plurality of signal traces to the upper boundary of the background noise floor, calculate a plurality of average signal amplitudes across the predetermined frequency range based on the signal traces having signal amplitudes above the upper boundary of the background noise floor, and identify the plurality of average signal amplitudes as the carrier reference profile.

In some embodiments, the circuitry configured to collect signal data from the cable network system during the at least one identified time period may comprise circuitry configured to identify at least one time period in which no carriers are present in an upstream band, and collect signal data from the cable network system during the at least one identified time period.

In some embodiments, the cable network test instrument may further comprise a visual display. The circuitry of the controller may be configured to operate the display to provide a visual indication of a location of intermittent noise.

In some embodiments, the circuitry of the controller may be configured to operate the display to provide a first visual indicator when the location of intermittent noise is downstream from the node and to provide a second visual indicator when the location of intermittent noise is upstream from the node.

According to another aspect, a cable network test instrument comprises a port configured to be coupled to a node of a cable network system, and a controller electrically connected to the port that is configured to access data on the cable network system via the port. The controller includes circuitry configured to locate configuration messages related to an upstream band in data received from the cable network system, identify at least one time period in which no carriers are present in the upstream band based on at least one configuration message, collect signal data from the cable network system during the at least one identified time period, and analyze the collected signal data to determine whether intermittent noise is present at the node. In some embodiments, the controller may further comprise circuitry configured to identify an upper boundary of a background noise floor in the collected signal data across a predetermined frequency range of the cable network system, generate a plurality of signal traces based on the collected signal data, isolate a number of signal traces in the plurality of signal traces based on the upper boundary of the background noise floor, and identify intermittent noise present at the node based on the number of isolated signal traces.

According to another aspect, a method for locating intermittent noise in a cable network system is disclosed. The method comprises operating a test instrument at a first node of the cable network system to collect signal data from the cable network system and generate a plurality of signal traces based on the collected signal data, isolating, with the test instrument, a number of signal traces in the plurality of signal traces based on a carrier reference profile and an upper boundary of a background noise floor of a predetermined frequency range, operating the test instrument to generate an output signal based on the number of isolated signal traces, and determining, based on the output signal, whether intermittent noise is present.

In some embodiments, the method may further comprise operating the test instrument to generate a histogram of signal amplitudes based on the collected signal data, separate the predetermined frequency range into a plurality of frequency bins, each frequency bin including a portion of the predetermined frequency range, identify, for each frequency bin, a minimum peak signal amplitude having the highest probability in the histogram, follow a slope of the bars of the histogram from the identified minimum peak signal amplitude to a minimum signal amplitude for each frequency bin, and identify the minimum signal amplitudes for the frequency bins as the upper boundary of the background noise floor for the predetermined frequency range.

In some embodiments, the method may further comprise operating the test instrument to compare a plurality of signal amplitudes in each signal trace of the plurality of signal traces to the upper boundary of the background noise floor, calculate a plurality of average signal amplitudes across the predetermined frequency range based on the signal traces having signal amplitudes above the upper boundary of the background noise floor, and identify the plurality of average signal amplitudes as the carrier reference profile.

In some embodiments, isolating, with the test instrument, a number of signal traces in the plurality of signal traces may comprise cross-correlating, with the test instrument, each signal trace of the plurality of signal traces with the carrier reference profile, operating the test instrument to compare each cross-correlation to a predetermined threshold, and identifying, with the test instrument, each signal trace as including a carrier when the cross-correlation associated exceeds the predetermined threshold.

Additionally, in some embodiments, isolating, with the test instrument, a number of signal traces in the plurality of signal traces may further comprise identifying, with the test instrument, a plurality of signal amplitudes present in the plurality of signal traces that are less than the upper boundary of the background noise floor.

In some embodiments, operating the test instrument at the first node of the cable network system to collect signal data from the cable network system may comprise identifying, with the test instrument, at least one time period in which no carriers are present in an upstream band and collecting at the first node, with the test instrument, signal data from the cable network system during the at least one identified time period.

BRIEF DESCRIPTION OF THE DRAWINGS

The detailed description particularly refers to the following figures, in which.

DETAILED DESCRIPTION OF THE DRAWINGS

Figure 1:
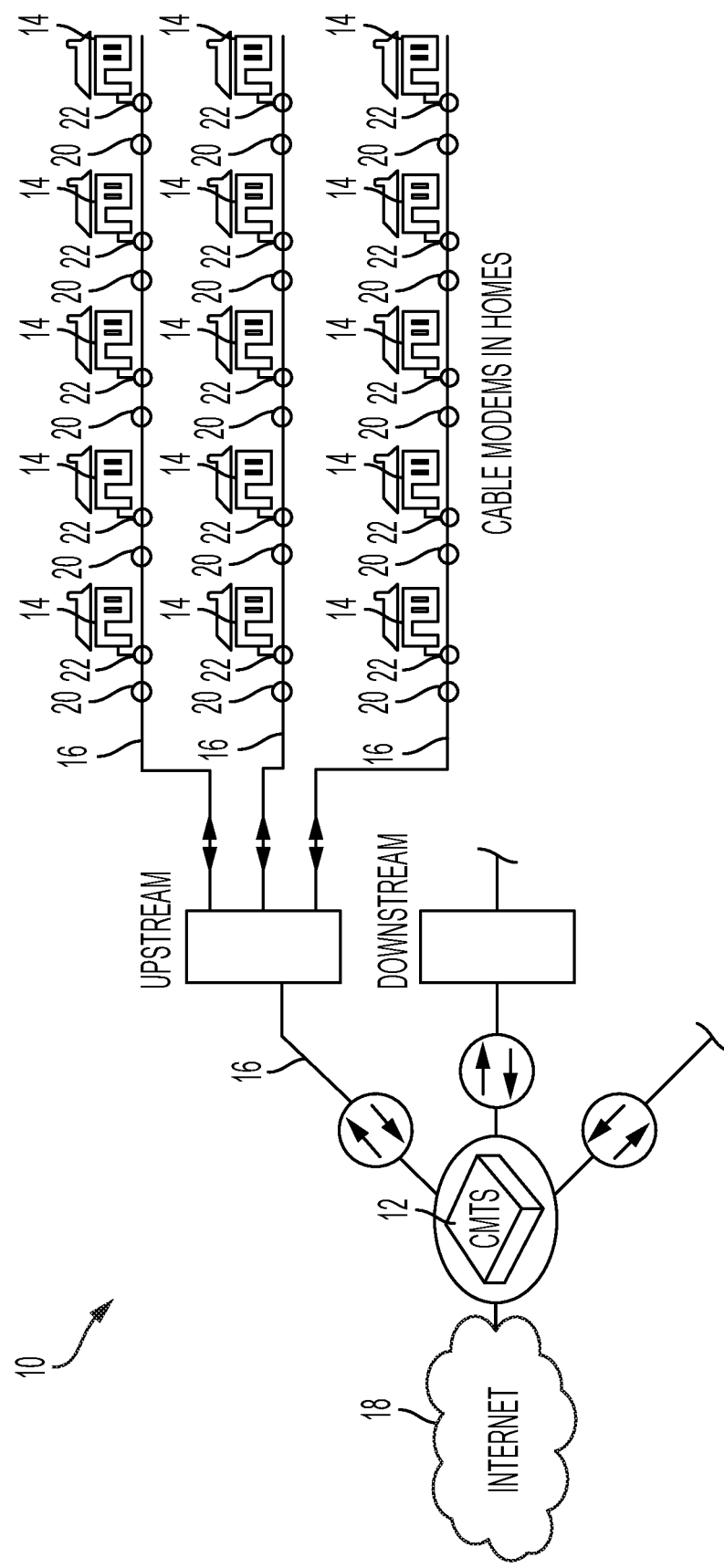
FIG. 1 is a diagram of a cable network system.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

As shown in FIG. 1, a cable network system 10 includes a Cable Modem Termination System (hereinafter sometimes CMTS) 12 that may be located at a cable company's head end or local office. The CMTS 12 obtains and modulates programming material onto appropriate carriers for distribution to cable modems 14 located at subscribers' premises. Subscribers' premises may include offices, homes, apartments, or other spaces at which network content is desired. In the illustrative embodiment, the carriers are combined for distribution downstream to subscribers over the forward path. Signals going upstream from subscribers' premises are routed in the return path.

The CMTS 12 is connected to the cable modems 14 via a plurality of data lines 16 such as, for example, coaxial cable and/or optical fiber that transport the cable network signals. In some embodiments, the cable network signals are transported as radio frequencies (RF). The signals may also be transported in hybrid systems including optical transmission portions in which the RF signals are converted to light for fiber optic transmission over some portions of the signal path and as RF signals over other portions of the signal path. The CMTS 12 also communicates with the other components of the cable network system 10 via the Internet 18. To do so, the CMTS 12 is configured to convert signals it receives from each cable modem 14 into Internet Protocol (IP) packets, which are then transmitted over the Internet 18. Transmissions from the cable modems 14 to the CMTS 12 are referred to as "upstream" transmissions or signals. The CMTS 12 is also configured to send signals "downstream" to the cable modems 14 by processing the signals it receives via the Internet 18 and then transmitting them to the cable modems 14.

The cable network system 10 also includes a number of nodes 20, 22. The nodes include a number of amplifiers 20 that are positioned throughout the cable network system 10 to compensate for signal loss caused by, for example, imperfections in the data lines or splitting of the signal during distribution. The cable network system 10 also includes a plurality of distribution taps 22 that provide points at which the subscribers' premises (and hence the cable modems 14) may be connected. In the illustrative embodiment, a single distribution tap 22 is connected to a single subscriber's premises via a coaxial cable. It should be appreciated that in other embodiments one or more of the taps may split the signals for distribution into two, four, or eight subscribers' premises. It should also be appreciated that a single node may include both an amplifier and a distribution tap.

The cable network system 10 may include any number of "upstream" and "downstream" channels and carriers within each channel to carry data over the data lines 16 between the CMTS 12 and the cable modems 14 on the system 10. Currently, cable network systems provide either four or eight active upstream channels in the upstream frequency band. In some embodiments, there may be as many as 8192 upstream channels. The upstream band, like any other frequency band allocated for communication, is desired to have a minimal amount of interference, but external sources generate ingress noise that interferes with the upstream band. Such external sources include personal electronic devices such as computers, electric motors, cellular towers, and other sources outside of the cable network system 10. Cable network operators seek to locate and isolate such external sources to eliminate the interference and improve the operation of the cable network system 10.

Figure 2:
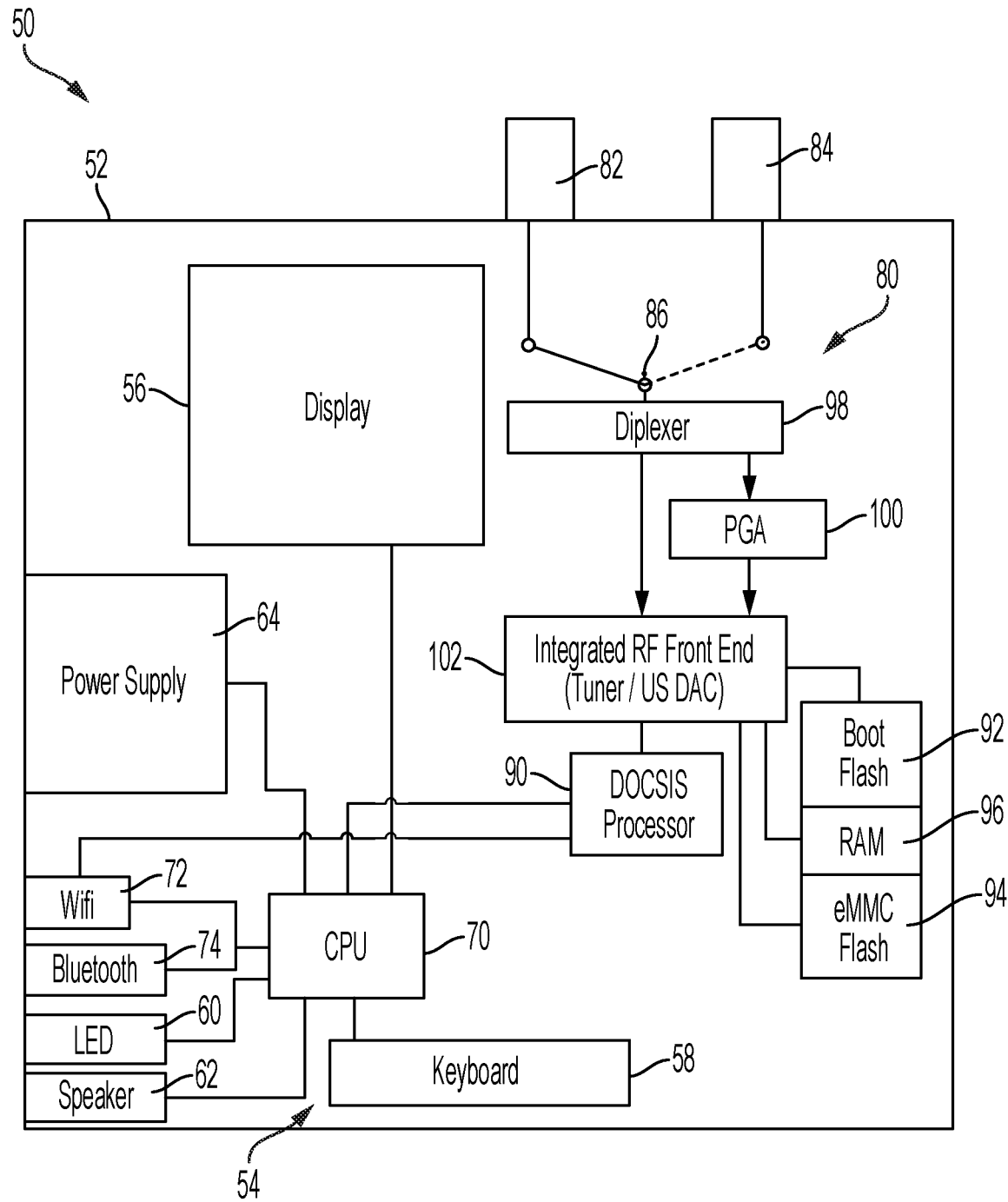
FIG. 2 is a simplified block diagram of a test instrument configured to locate intermittent noise in the cable network system of FIG. 1.

Referring now to FIG. 2, a test instrument 50 for use in locating intermittent noise in the upstream band of the cable network system 10 is shown. Intermittent noise may be periodic noise of short duration generated by, for example, automobile ignition noise or high-voltage power line corona noise, or random noise generated by, for example, atmospheric noise from thunderstorms. In the illustrative embodiment, the test instrument 50 includes an outer casing 52 that houses electronic circuitry 54 configured to collect and process signal data from the cable network system 10. The test instrument 50 has a user interface that includes an integrated display 56, a keyboard 58, visual indicators (e.g., light-emitting diodes) 60 associated with different functions of the test instrument 50, and a speaker 62. In the illustrative embodiment, the integrated display 56 is a liquid crystal display.

The test instrument 50 also includes a power supply 64 configured to supply power to the other electronic circuitry 54. The power supply 64 may include a rechargeable battery pack mounted in the casing 52 and/or circuitry for connecting the test instrument 50 to a standard wall outlet.

The test instrument 50 also includes a central processing unit (CPU) or controller 70, which is operable to selectively control the other electronic circuitry 54 of the test instrument 50. In the illustrative embodiment, the CPU 70 is a microprocessor configured to boot or power-up the circuitry required to collect and analyze signal data from the system 10. It should be appreciated that in other embodiments the CPU may take the form of a field programmable gate array (FPGA) or other electronic device configured to control the operation of the circuitry 54. In the illustrative embodiment, the CPU 70 is connected to the keyboard 58 to receive inputs from the technician and to the display 56 and indicators 60 to provide outputs and other information to the technician regarding the operation of the test instrument 50 and, for example, the data acquired during testing. Any measurements or other data collected by the test instrument 50 may be transmitted a monitoring system via a Wi-Fi transceiver 72 that is connected to the CPU 70. As shown in FIG. 2, the test instrument 50 includes a transceiver 74 operable to transmit and receive signals from a mobile device via the Bluetooth communications protocol.

The test instrument 50 also includes a DOCSIS engine or modem 80 operable to measure and evaluate signals in the system 10 via a pair of ports or connectors 82, 84. In the illustrative embodiment, the connectors 82, 84 are F-connectors configured to be connected to the coaxial cabling in the system 10. In that way, the instrument 50 may be connected at various points on the system 10 to collect data and isolate noise, as described in greater detail below. It should be appreciated that in other embodiments the test instrument 50 may include other input/output ports to connect the test instrument 50 to the system 10. In still other embodiments, the instrument 50 may utilize the transceiver 72 to access data on the system 10.

As shown in FIG. 2, the test instrument 50 includes a switch 86 operable to selectively connect the connectors 82, 84 to the DOCSIS modem 80. The switch 86 is connected to the CPU 70 such that it may be operated by the CPU 70 in response to user inputs. It should be appreciated that in other embodiments the instrument may include additional switches to permit both connectors to be connected to the DOCSIS modem 80 at the same time. In still other embodiments, the connectors may be connected directly to the modem 80.

The DOCSIS modem 80 includes a controller 90 that is connected to the CPU 70. In the illustrative embodiment, the controller 90 is a microprocessor such as, for example, a Puma 7 chip, which is commercially available from Intel Corporation. It should be appreciated that in other embodiments the controller may take the form of a field programmable gate array (FPGA) or other electronic device configured to process signals received from the system 10. In the illustrative embodiment, the CPU 70 and the controller 90 constitute the main electronic controller of the instrument 50 to operate the other circuitry 54 to collect and analyze data from the system 10. The modem 80 also includes in the illustrative embodiment a flash memory 92 for booting the microprocessor 90 and flash memory 94 and RAM memory 96 to support other operations of the DOCSIS modem 80. The flash memory 94 is illustratively eMMC, and the RAM memory 96 is illustratively DDR3. In some embodiments, the controller 90 may be configured to demodulate individual Quadrature Amplitude Modulation (QAM) digital television signals in the cable network system 10 and may include other circuitry to handle the differences in data encoding and decoding such signals.

As shown in FIG. 2, the modem 80 includes a diplexer circuit 98 configured to process signals received via F-connectors 82, 84. The modem 80 also includes a programmable gain amplifier (PGA) 100 that is operable to provide high transmission power required for the modem 80 and a digital to analog conversion (DAC) circuit 102 operable to convert the analog radio frequency signals received via the F-connectors 82, 84 to digital signals for use by the processor 90. To do so, the DAC circuit 102 is configured to tune the analog radio frequency signals and implement automatic gain control of those signals. The DAC circuit 102 also selects the channel and performs related functions to make individual QAM signals for the channels in the cable network system 10 available for further processing.

Figure 3:
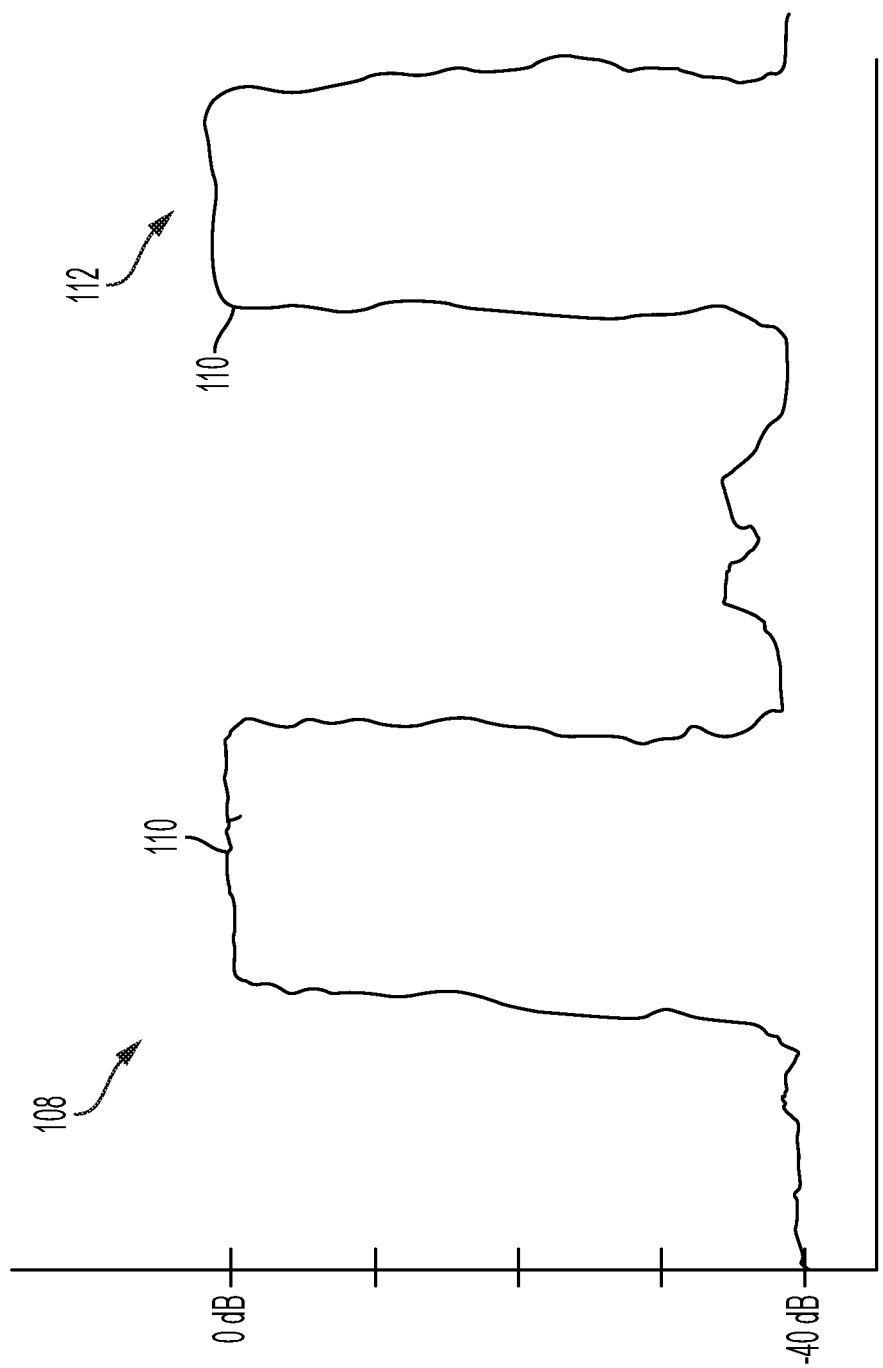
FIG. 3 is an exemplary diagram of a portion of the upstream frequency band of the cable network system including at least one source of intermittent noise.

The output of the DAC circuit 102 is provided to the processor 90 for demodulation. As described above, the test instrument 50 is configured to collect and analyze data to assist technicians to detect and identify intermittent noise present in the upstream band of the cable network system 10. As shown in FIG. 3, the upstream carriers 110 are substantially orthogonal narrow-bandwidth data signals within the upstream frequency band. Each upstream carrier 110 has a carrier-to-interference (i.e., the sum of noise, distortion, common-path distortion and cross modulation, and the sum of discrete and broadband ingress signals, intermittent noise excluded) ratio of greater than 25 dB. If an intermittent noise signal is present when the measurement is taken and has sufficient signal amplitude (e.g., it is magnitude greater than 25 dB), it is visible even when the carriers 110 are present, as indicated by the peak 112 in FIG. 3.

Figure 4:
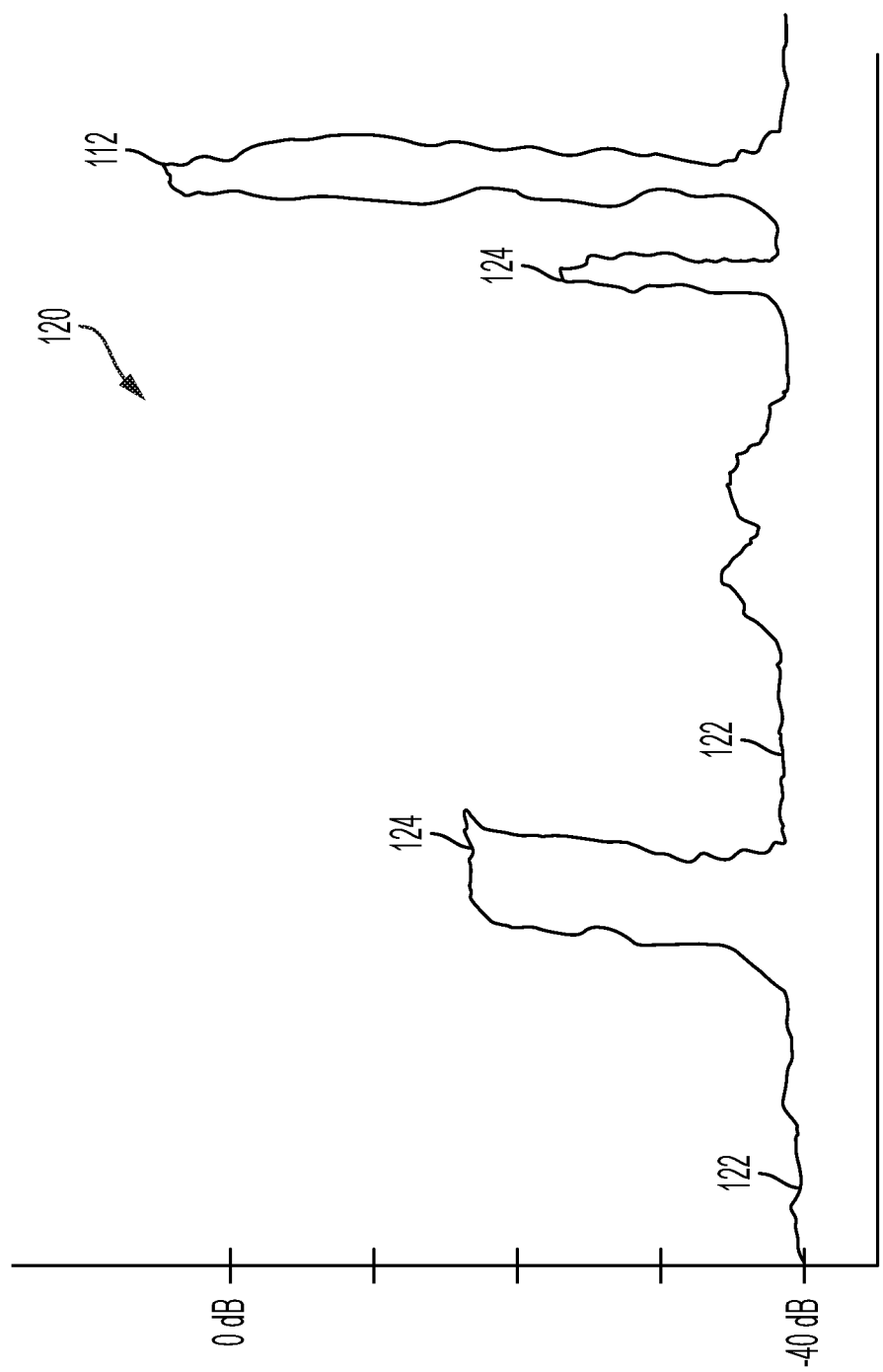
FIG. 4 is an exemplary view of a display of the test instrument of FIG. 3 showing intermittent noise and the noise floor present at a node.

Intermittent noise having a signal amplitude that is less than the amplitude of the carriers 110 may be masked by the carriers 110 and, as a result, is not visible when the carriers 110 are present. For example, as shown in FIG. 4, the cable network system has a noise floor 122 and a number of peaks 124 indicative of intermittent noise. Because the signal amplitude of the peaks 124 are less than, for example, 0 dB (i.e., have a magnitude of less than 25 dB in this example), they would not have been visible when the carriers 110 were present.

Figure 5:
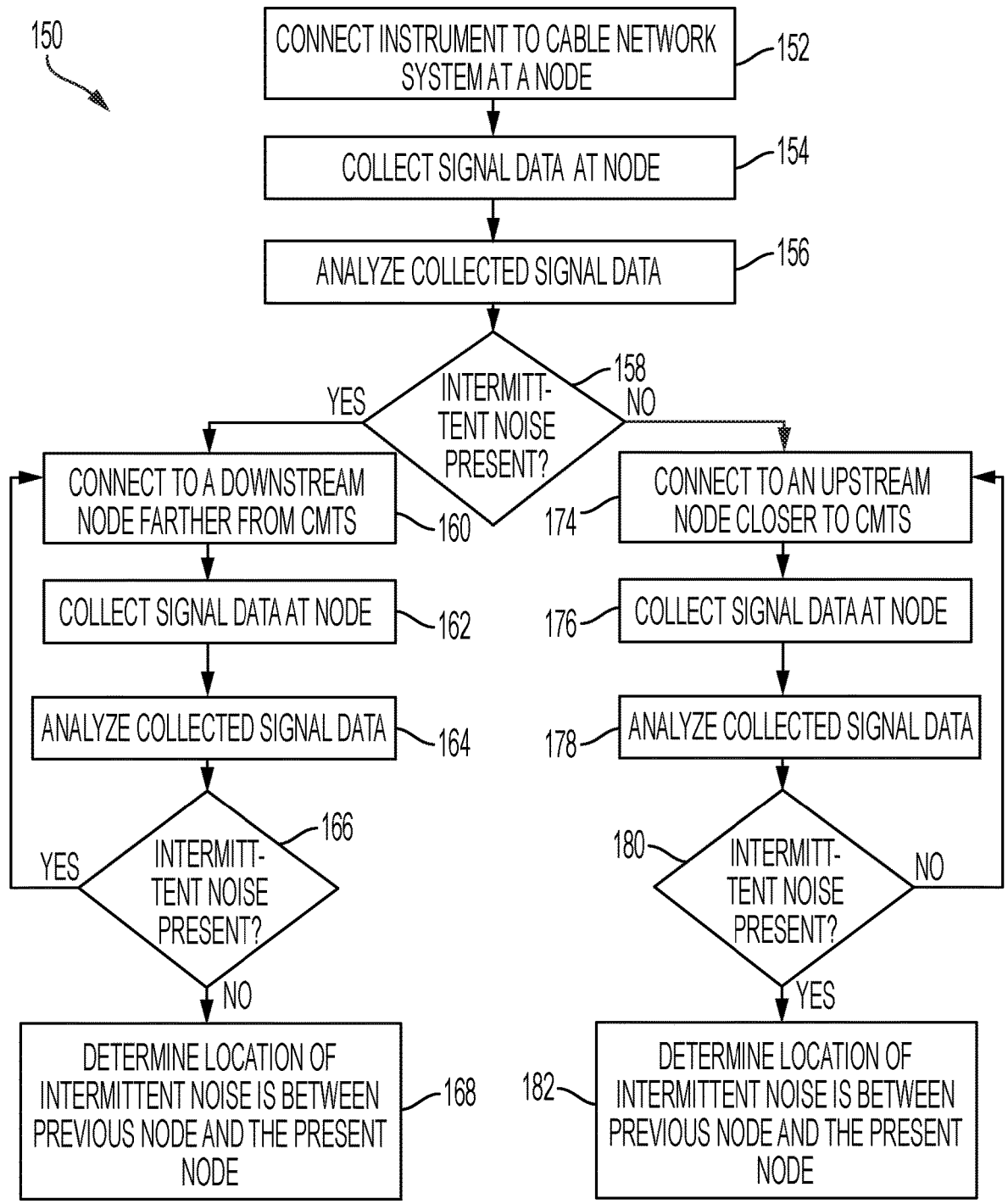
FIG. 5 is a block diagram of a diagnostic technique for locating intermittent noise.

Referring now to FIG. 5, an exemplary diagnostic technique 150 for detecting noise utilizing the test instrument 50 includes a number of steps to help technicians detect and identify intermittent noise present in the upstream band of the cable network system 10. The method 150 begins with block 152 in which the technician connects the test instrument 50 to a node of the cable network system 10. As described above, it should be understood that the term node may refer to, for example, one of the amplifiers 20 of the system 10 or a distribution tap 22 of the system 10. To connect to the node, the technician may connect one end of coaxial cable to, for example, the connector 84 of the test instrument 50 and the other end of the coaxial cable to a service port of the node. When the test instrument 50 is connected to the service port, the technician may operate the instrument 50 to collect signal data at the node in block 154. As described in greater detail below, the technician may then operate the instrument 50 to analyze the signals present in the data lines 16 for the upstream and/or downstream bands of the system 10 in block 156.

The diagnostic technique may then advance to block 158 in which the technician determines, based on the collected data and the analysis performed in block 156, whether intermittent noise is present. When the technician locates intermittent noise, the technician may determine that the intermittent noise source is farther away from the CMTS 12 and the head end. In the illustrative embodiment, the CPU/controller 70 also operates the display 56 to provide a visual indication to the technician that the intermittent noise source is downstream from the node. The method 150 then advances to block 160 in which the technician disconnects the instrument 50 from the first node and moves to another node that is farther downstream from the CMTS 12. At that downstream node, the technician connects the instrument 50 to a test port in a manner similar to that described above in regard to block 152 and operates instrument 50 to collect and analyze the signals present in the data lines 16 in blocks 162, 164, respectively.

The diagnostic technique may then advance to block 166 in which the technician determines, based on the collected data and the analysis performed in block 164, whether intermittent noise is present. If the technician locates intermittent noise at the node in block 166, the CPU/controller 70 again operates the display 56 to provide a visual indication to the technician that the intermittent noise source is downstream from the node. The method 150 then returns to block 160 in which the technician disconnects the instrument 50 from the node and moves to another node that is farther downstream from the CMTS 12. The technician then repeats the tasks of blocks 162, 164, 166 to determine whether intermittent noise is present at the new node. If noise is present, the technician may continue moving downstream until the technician no longer locates intermittent noise in the upstream band.

If the technician does not locate any intermittent noise at the node in block 168, the method 150 advances to block 168 in which the test instrument 50 provides an indication to the technician that the intermittent noise is located between the previous node (i.e., the node upstream) and the present node. In the illustrative embodiment, the indication is a visual indicator activated by the CPU 70 on the integrated display 56. In other embodiments, the indication may be an audible indication or a combination of audible and visual indications. In still other embodiments, the instrument may not provide any additional indication of the intermittent noise location. The technician may then inspect the area surrounding the present node to locate possible sources of intermittent noise. For example, if the node is a distribution tap 22 at a subscriber's premises, the technician may search for electronic devices near the data lines 16 and may inspect the data lines 16 and/or other cabling to locate breaks or other flaws that might provide a path for intermittent noise to intrude into the system 10. The technician may then return to the previous node (i.e., the upstream node at which intermittent noise was detected) and repeat the tasks in blocks 162, 164, 166 to determine whether intermittent noise continues to be present.

Returning to block 158, if the technician fails to locate any noise at the first node (i.e., the node at which the technician performed the tasks of blocks 152, 154, 156), the technician may determine that the intermittent noise source is closer (i.e., upstream) to the CMTS 12 and the head end. In the illustrative embodiment, the CPU/controller 70 also operates the display 56 to provide a visual indication to the technician that the intermittent noise source is upstream from the node. The method 150 then advances to block 174 in which the technician disconnects the instrument 50 from the first node and moves to another node that is upstream from the first node and closer to the CMTS 12. At that upstream node, the technician connects the instrument 50 to a test port in a manner similar to that described above in regard to block 152 and operates instrument 50 to collect and analyze the signals present in the data lines 16 in blocks 176, 178, respectively.

The diagnostic technique may then advance to block 180 in which the technician determines, based on the collected data and the analysis performed in block 178, whether intermittent noise is present. If, in block 178, the technician does not locate any intermittent noise at the node, the technician may again determine that the intermittent noise source is closer to the CMTS 12 and the head end, and the CPU/controller 70 operates the display 56 to provide a visual indication to the technician that the intermittent noise source is upstream from the node. The method 150 then returns to block 174 in which the technician disconnects the instrument 50 from the node and moves to another node that is upstream and closer to the CMTS 12. The technician then repeats the tasks of blocks 176, 178, 180 at the new upstream node to determine whether intermittent noise is present at the new node. If noise is not present, the technician may continue moving upstream and taking more measurements until the technician locates intermittent noise in the upstream band.

If the technician locates intermittent noise at the node in block 180, the method 150 advances to block 182 in which the test instrument 50 provides an indication to the technician that the intermittent noise is located between the previous node (i.e., the node downstream) and the present node. In the illustrative embodiment, the indication is a visual indicator on the integrated display 56. In other embodiments, the indication may be an audible indication or a combination of audible and visual indications. In still other embodiments, the instrument may not provide any additional indication of the intermittent noise location. The technician may then inspect the area surrounding the present node to locate possible sources of intermittent noise in a manner similar to that described above in regard to block 170. The technician may then repeat the tasks in blocks 176, 178, 180 to determine whether intermittent noise continues to be present at that node.

Figure 6:
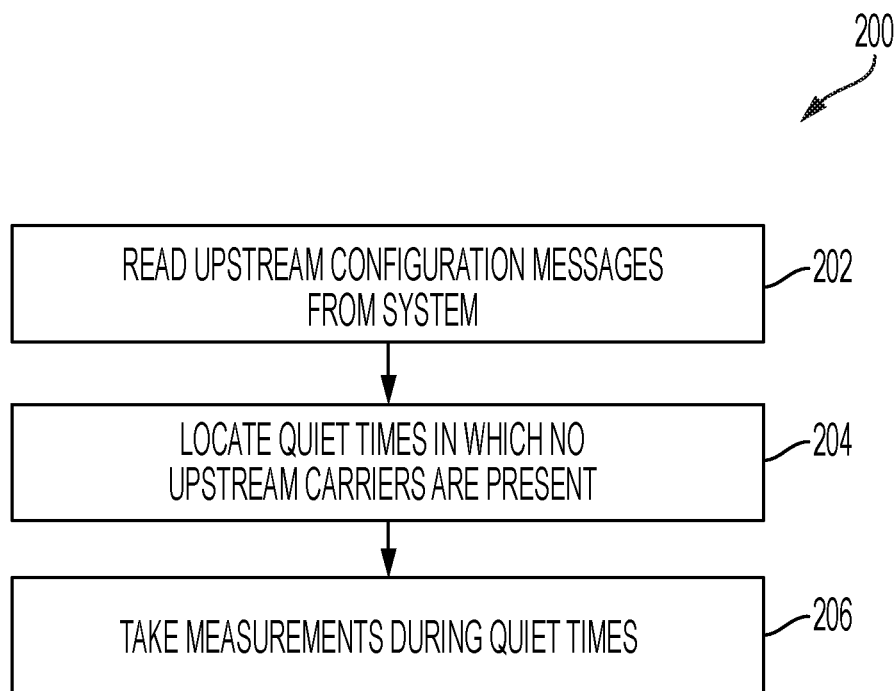
FIG. 6 is a block diagram of a technique for collecting signal data in the diagnostic technique of FIG. 5.

Referring now to FIG. 6, the technician may operate the test instrument 50 to execute a sub-routine 200 for collecting and analyzing signal data at a node in blocks 154, 162, 176 of the technique 150 in one embodiment. The sub-routine 200 illustratively begins in block 202 in which the DOCSIS modem 80 of the instrument 50 obtains the upstream configuration messages from the CMTS 12. In a cable network complying with the DOCSIS standard, the CMTS 12 transmits messages on the forward path that are utilized by the cable modems 14 to determine when and how to properly transmit data onto the return path. These configuration messages include the Upstream Channel Descriptor (UCD) message for each upstream carrier. Each UCD message includes a description of parameters such as the modulation, symbol rate, channel width, and frequency for each upstream carrier. The sub-routine 200 then advances to block 204.

In block 204, the DOCSIS modem 80 accesses the UCD messages and, based on the parameters in the messages, determines the periods in which the upstream carriers within the upstream channels are not or will not be present in the return path. Examples of such "quiet times" or "quiet periods" include the range and register periods, which are set aside by the system 10 to permit new modems to log into the cable network. During these quiet times, only the noise floor and intermittent noise (if any) are present in the upstream band. In the illustrative embodiment, each quiet period may be at least 10 microseconds in length. In absence of information on the timing of signal transmission, the quiet time may be identified based on the received signal power.

With the quiet times identified, the controllers 70, 90 of the instrument 50 are configured in block 206 of the sub-routine 200 to operate the other circuitry 54 to take measurements from the system 10 during the quiet times. Because intermittent noise may be random and may not occur during any particular quiet time, the controllers 70, 90 are configured to take data in a series of snap shots over a series of consecutive quiet times. It should be appreciated that in other embodiments data may be taken in only a single snap shot (i.e., during a single quiet time). The raw data is processed using Fast Fourier Transforms to obtain the signal amplitude and frequency of the signals present in the upstream band.

It should be appreciated that in other embodiments the test instrument may be configured to communicate with the system 10 to request an extended register period. In such embodiments, the test instrument does not utilize the quiet times already present in the system 10 but instead requests a special grant of extended time from the system 10 during which no upstream carriers are present in the return path. The test instrument may be configured to record all of its noise measurements during this extended time. The amount of extended time could be as little as a millisecond.

The data gathered using the sub-routine 200 may be utilized in blocks 156, 164, 178 of the technique 150 to determine whether intermittent noise is present. To do so, the technician may operate the test instrument 50 to cause the CPU 70 to perform a statistical analysis of the data to parse the signal amplitude of the intermittent noise from the other signals present in the system 10. As used herein, the term "signal amplitude" refers to a power level of a received signal and may be represented in decibels (dB) or decibels per millivolt (dBmV). In that way, the signal amplitude represents the received energy of the signals collected by the test instrument. In the illustrative embodiment, the test instrument 50 performs a standard deviation analysis of the data and also calculates an average amplitude at each frequency. The instrument 50 is programmed to identify a signal with a high standard deviation (i.e., the data points are spread out over a range of values) and a low average (low arithmetic mean) as a noise floor signal and to identify a signal with the low standard deviation (i.e., the data points are close to an arithmetic mean) and a high average (high arithmetic mean) as intermittent noise. In other embodiments, the test instrument may be configured to perform a peak-hold analysis to locate any intermittent noise in the data. In still other embodiments, the test instrument may be configured to perform both a statistical analysis and a peak-hold analysis to determine whether intermittent noise is present.

The instrument 50 may also be configured to display a plot of the data on the integrated display 56, which may take the form of the plot 120 shown in FIG. 4. As described above, the plot 120 includes a noise floor 122 and a number of peaks 124 indicative of intermittent noise. Because the amplitude of the peaks 124 are less than, for example, 0 dB (i.e., have a magnitude of less than 25 dB in this example), they would not have been visible when the carriers 110 were present but are visible in the data taken during the quiet periods.

Figure 7:
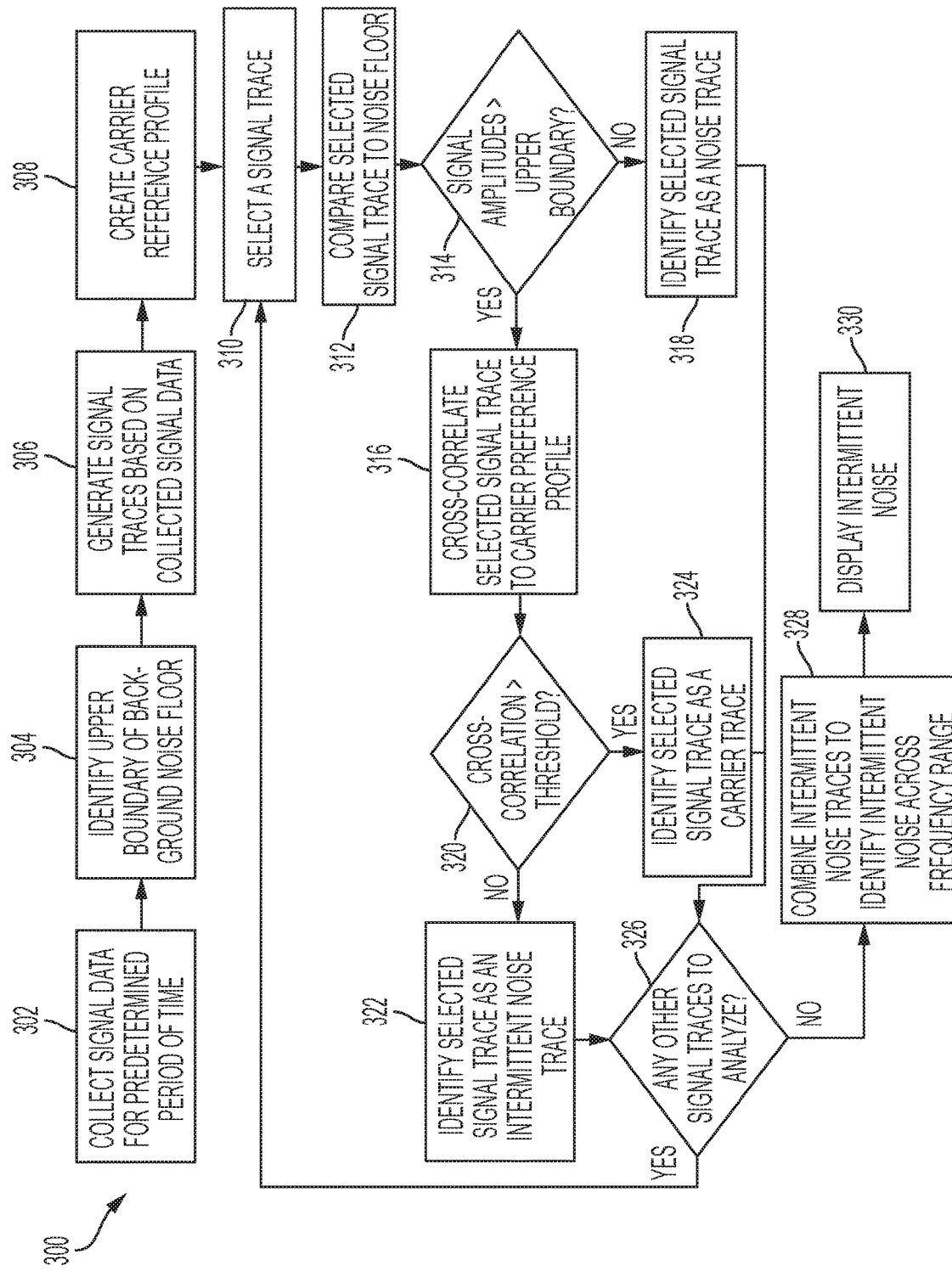
FIG. 7 is a block diagram of a technique for collecting and analyzing signal data collected in the diagnostic technique of FIG. 5.

Referring now to FIG. 7, the technician may operate the test instrument 50 to execute another sub-routine 300 for collecting and analyzing signal data when performing the technique 150. The sub-routine 300 may begin with block 302 in which the technician operates the test instrument 50 to collect signal data over a frequency range corresponding to the upstream band for a predetermined period of time. In the illustrative embodiment, the predetermined period of time is in a range of tens of microseconds. Unlike the sub-routine 200, signal data may be collected continuously when the test instrument 50 is connected to the cable network system and not only during the quiet times. It should be appreciated that in other embodiments the sub-routine 300 may utilize the sub-routine 200 to focus its data collection during the quiet periods.

After the data is collected, the sub-routine 300 may advance to block 304 in which the technician operates the test instrument 50 to locate the noise floor of the cable network system. To do so, the CPU/controller 70 of the instrument 50 is configured to generate a histogram of signal amplitudes of the signals collected to block 302 across the upstream frequency band. The histogram is illustratively a graphical representation of an estimated probability distribution of the signal amplitudes of the collected data. The controller 70 is further configured to separate the upstream frequency band into a number of frequency bins. The width of each frequency bin is set based on sampling rate and resolution of the frequency transform. In the illustrative embodiment, each frequency bin is 100 kHz wide, but it should be appreciated that in other embodiments each frequency bin may be larger in size or as small as a single hertz. The controller 70 then analyzes the histogram associated with data collected for each frequency bin.

Figure 8:
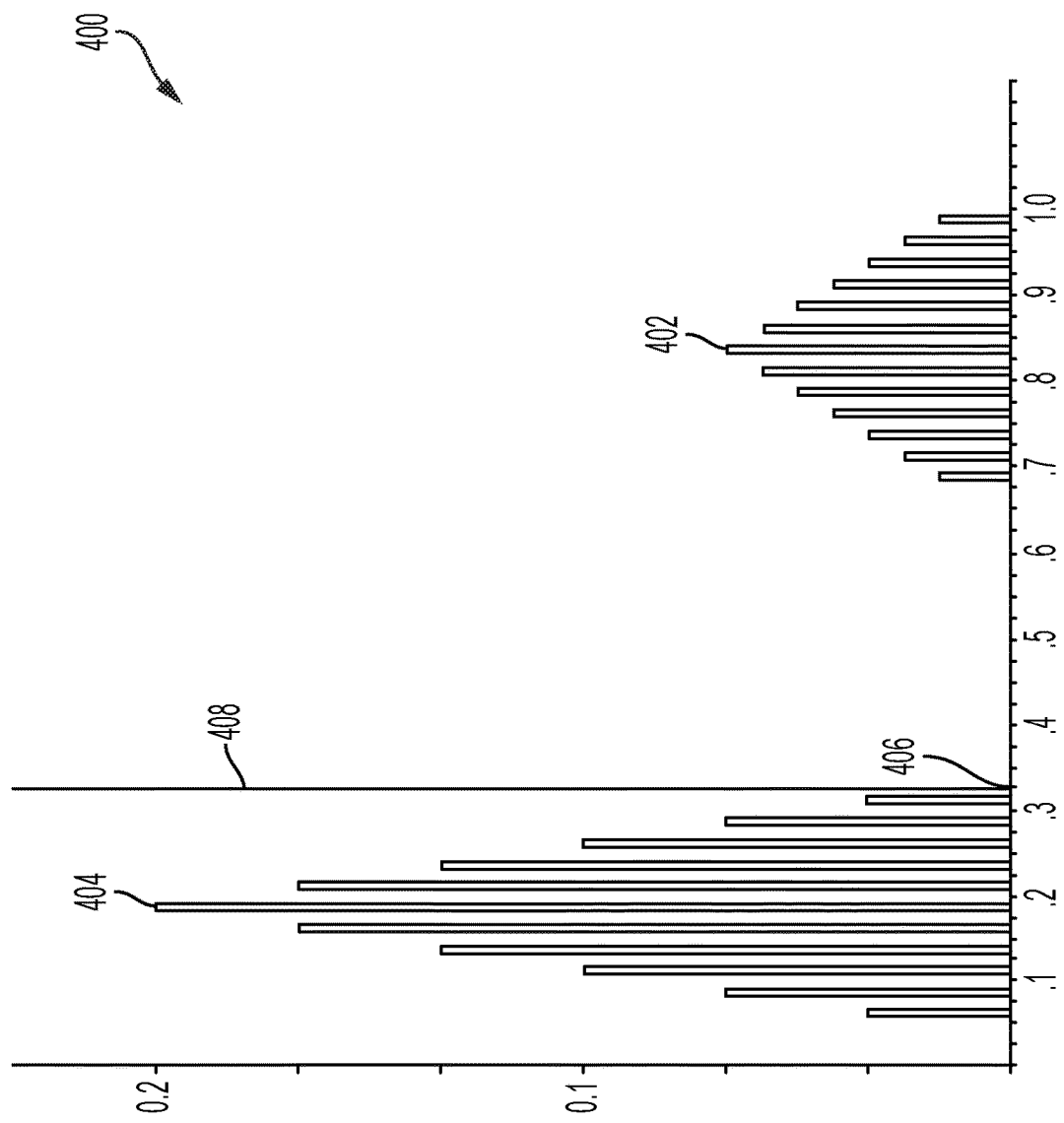
FIG. 8 is an illustration of a histogram of signal amplitudes for a frequency bin.

One exemplary histogram for a frequency bin 400 is shown in FIG. 8. As shown in FIG. 8, the frequency bin 400 includes two normalized signal amplitude peaks 402, 404, which represent two concentrations of received energy in the collected signals associated with frequency bin 400. It should be appreciated that other frequency bins of the upstream frequency band may include additional normalized signal amplitude peaks. The normalized signal amplitude peak 402 is at a relatively high magnitude, indicating signals having a high probability as well as high energy such as, for example, a carrier of the cable network system. The other normalized signal amplitude peak 404 is at a relatively low magnitude, indicating signals having a high probability but low energy. Such signals are likely associated with background noise sources that form the noise floor of the cable network system (and the test instrument 50).

In block 304, the controller 70 is configured to locate the normalized signal amplitude peak 404, which is the minimum peak signal amplitude in the frequency bin 400 that has the highest probability. The controller 70 is further configured to follow the slope of the bars of the histogram from the normalized signal amplitude peak 404 to a minimum signal amplitude 406 shown in FIG. 8. The controller 70 then registers the minimum signal amplitude 406 as part of the upper boundary 408 of the noise floor. The controller 70 may then perform a similar analysis for each of the frequency bins to identify the minimum signal amplitude in each frequency bin. The controller 70 may then identify all of the minimum signal amplitudes together as the upper boundary 408 of the noise floor across the entire upstream frequency band.

It should be appreciated that in other embodiments the controller may be configured to calculate the standard variation associated with the normalized signal amplitude peak 404. The controller may then use the standard variation to locate the minimum signal amplitude and hence the upper boundary of the noise floor.

Figure 9:
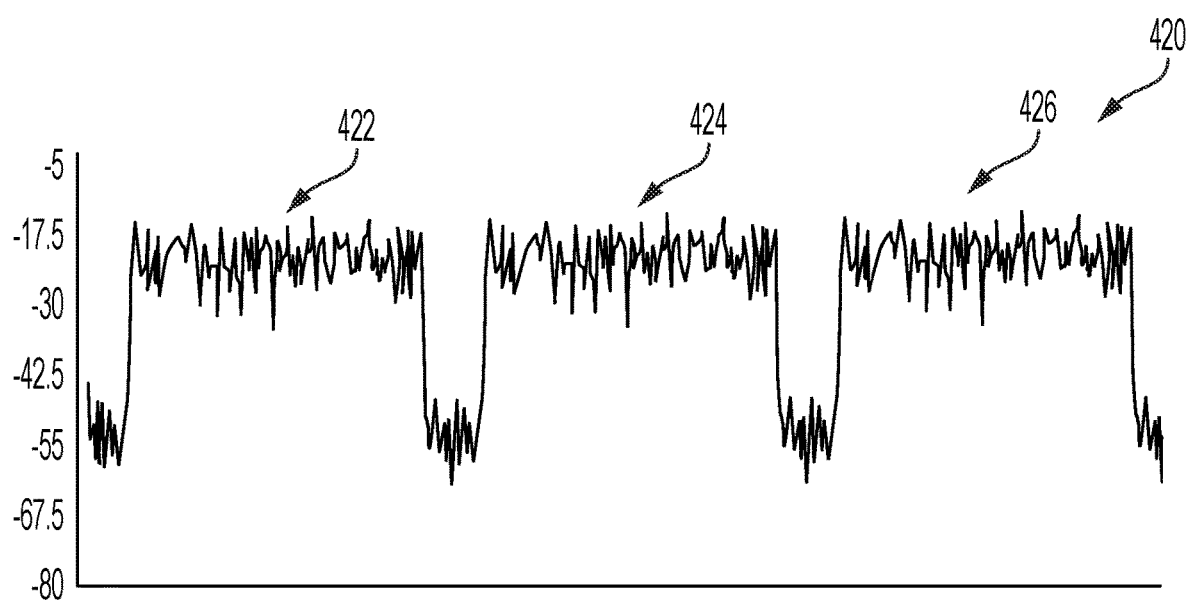
FIG. 9 is an exemplary portion of a signal trace based on data collected using the technique of FIG. 7.

The sub-routine 300 may advance to block 306 in which the controller 70 generates a number of signal traces from the collected signal data. A signal trace is illustratively a fixed window Fast Fourier Transform of a portion of the signal data collected in block 302. Each signal trace includes signal amplitudes at frequencies across some or all of the upstream frequency band that were collected over a sample interval. An exemplary signal trace 420, including a number of carriers 422, 424, 426, is shown in FIG. 9. Each signal trace may include signal data associated with the entire upstream frequency band or only a portion of the frequency band. The size of the carrier that carries data for each signal trace depends on the allowed bandwidth allocated by the CMTS to a cable modem for data transmission according to the DOCSIS standard. The controller 70 generates the signal traces and then stores them in a memory buffer for further processing, as described in greater detail below.

The sub-routine 300 may advance to block 308 in which the controller 70 generates a carrier reference profile. To do so, the controller 70 marks the upper boundary 408 of the noise floor in each signal trace generated in block 306. The controller 70 identifies the signal amplitudes in each signal trace that are at a predetermined level above the upper boundary 408 of the noise floor and calculates an average of the signal amplitudes at each frequency or frequency bin in the upstream frequency band. The controller 70 uses the averages of the signal amplitudes to generate a carrier reference profile 430 for the upstream frequency band. As described in greater detail below, the carrier reference profile is used later in sub-routine 300 to separate signal traces, like signal trace 420, that include one or more carriers from signal traces that do not.

Figure 10:
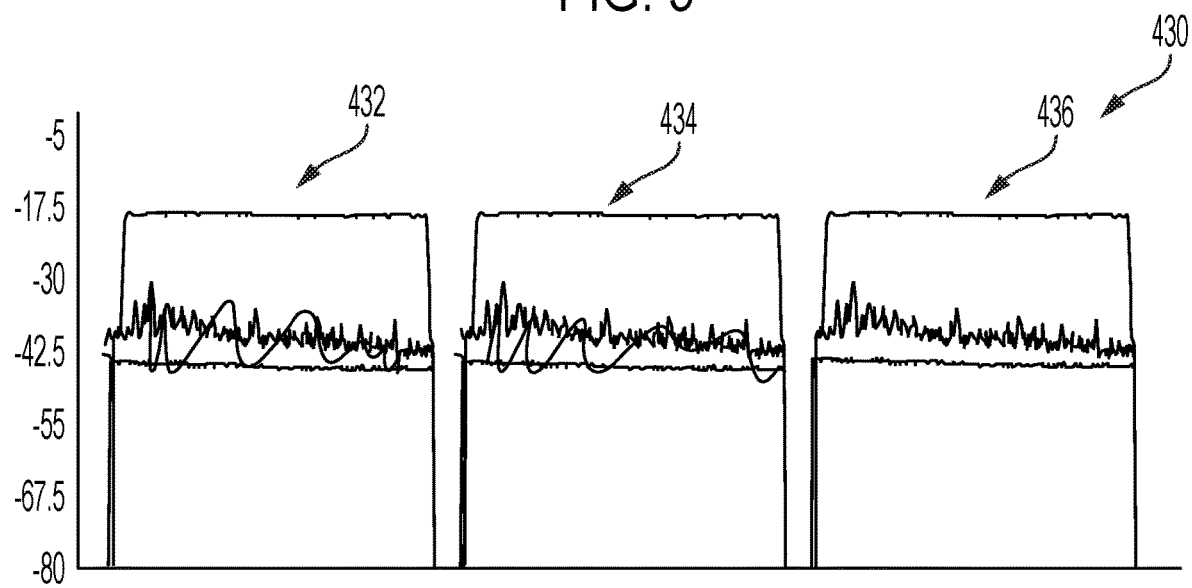
FIG. 10 is an exemplary portion of a carrier reference profile generated in the technique of FIG. 7.

A portion of the carrier reference profile 430 is shown in FIG. 10. The carrier reference profile 430 includes a reference carriers 432, 434, 436, which correspond to actual carriers present in the cable network system. It should also be appreciated that in other embodiments the carrier reference profile may be calculated based on a theoretical power density of the orthogonal frequency-division multiple access (OFDMA) or quadrature amplitude modulated (QAM) signals in the cable network system.

The sub-routine 300 may advance to block 310 in which the controller 70 selects a signal trace for further processing. In block 312, the controller 70 compares the selected signal trace to the upper boundary 408 of the noise floor. To do so, the controller 70 compares the signal amplitudes present in the selected trace to the signal amplitudes that define the upper boundary 408 of the noise floor. In block 314, the controller 70 determines whether the selected signal trace includes signal amplitudes that are greater than the upper boundary 408. If the signal amplitudes are greater than the upper boundary 408, the sub-routine 300 advances to block 316. If the selected signal trace has no signal amplitudes that are greater than the upper boundary 408, the sub-routine 300 advances to block 318 in which the controller 70 identifies the signal trace as a background noise trace that contains neither carriers nor intermittent noise. The sub-routine 300 may then advance to block 326 in which the controller 70 determines whether it has analyzed all of the signal traces generated in block 306, as described in greater detail below.

When the sub-routine 300 advances to block 316, the controller 70 performs a cross-correlation between the selected signal trace and the carrier reference profile generated in block 308. Exemplary cross-correlation techniques are shown and described in Theory and Application of Digital Signal Processing by Lawrence Rabiner et al. (Prentice-Hall 2015), which is incorporated by reference herein. If the controller 70 determines the cross-correlation is less than a predetermined correlation threshold in block 320, the sub-routine 300 advances to block 322. If the cross-correlation is greater than the predetermined threshold, the sub-routine 300 advances to block 324 in which the controller 70 identifies the signal trace as a carrier trace that contains one or more carriers. The sub-routine 300 may then advance to block 326 in which the controller 70 determines whether it has analyzed all of the signal traces generated in block 306, as described in greater detail below.

In the illustrative embodiment, the predetermined correlation threshold is adaptively based on the maximum amplitude of the corresponding reference carrier of the carrier reference profile and the upper boundary of the noise floor of the cable network system. For example, such an adaptive correlation threshold may be set to the mean (geometric) of the corresponding reference carrier and the upper boundary of the noise floor. It should be appreciated that in other embodiments the predetermined correlation threshold may be a fixed number determined based on experimental field trials.

Figure 11:
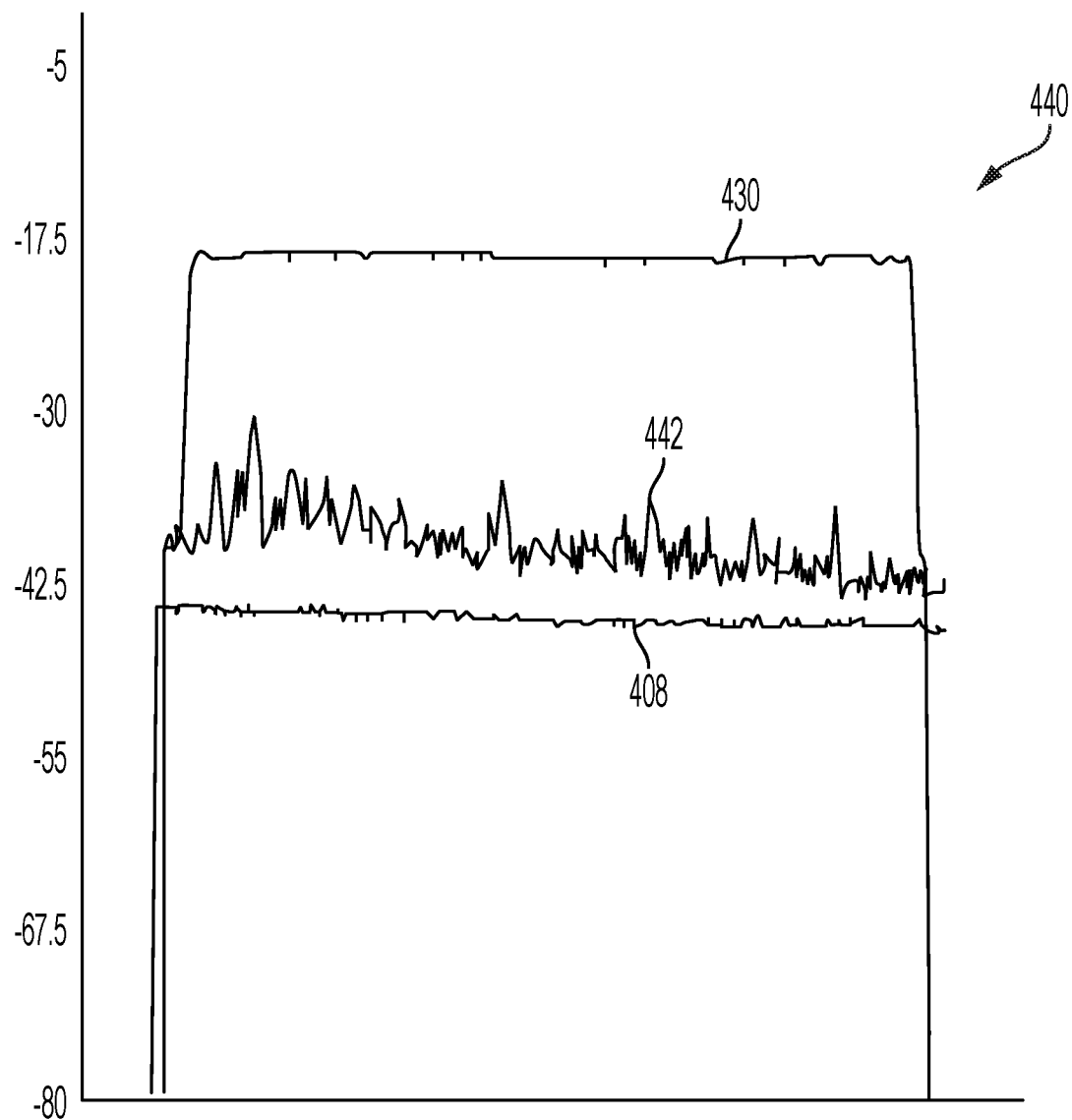
FIG. 11 is an exemplary signal trace showing intermittent noise.

When the sub-routine 300 advances to block 322, the controller 70 identifies the selected signal trace as an intermittent noise trace. In other words, the controller 70 marks the selected signal trace as containing signal amplitudes corresponding to intermittent noise present in the cable network system. One example of an intermittent noise trace is the intermittent noise trace 440 shown in FIG. 11, which includes a noise signal 442 that is present across a number of frequencies of the upstream band. As shown in FIG. 11, the noise signal 442 does not correlate to the carrier reference profile 430 and has signal amplitudes above the upper boundary 408 of the noise floor.

After the intermittent noise trace is identified as an intermittent noise trace, the sub-routine 300 may then advance to block 326 in which the controller 70 determines whether it has analyzed all of the signal traces generated in block 306. If signal traces remain in the buffer to be analyzed, the sub-routine 300 returns to block 310. If all signal traces have been analyzed, the sub-routine 300 advances to block 328.

In block 328, the controller 70 collects the intermittent noise traces (if any) and builds a single collection of the maximum signal amplitudes present in the intermittent noise traces to identify any intermittent noise present in the upstream frequency band. The controller 70 may then operate the display 56 to provide a visual plot of the signal amplitudes associated with intermittent noise in block 330. The technician may review the plot and confirm that intermittent noise is present in, for example, block 158 of the technique 150 shown in FIG. 3. It should be appreciated that if none of the signal traces were identified as intermittent noise traces, the controller 70 may operate the display 56 to provide an indication that no intermittent noise was detected at that node.

It should be appreciated that the instrument is typically operating at a different timing than the transmitters of the cable network system. As a result, there is possibility of capturing a carrier mid-way through transmission, which might lead to artifacts that the test instrument might mistake for intermittent noise. Some embodiments of the test instrument may therefore synchronize the data collection of the OFDMA signal by the means of the cyclic prefix to avoid recording such artifacts.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. A test instrument for locating intermittent noise in a cable network system, the test instrument comprising:
    a port configured to be coupled to a node of the cable network system; and
    a controller electrically connected to the port, the controller being configured to access data on the cable network system via the port, the controller being configured to:
        collect signal data from the cable network system;
        generate a plurality of signal traces based on the collected signal data;
        isolate a number of signal traces in the plurality of signal traces based on a carrier reference profile and an upper boundary of a background noise floor of a predetermined frequency range;

generate an output signal based on the number of isolated signal traces; and determine, based on the output signal, whether intermittent noise is present.

2. The test instrument of claim 1, the controller being further configured to:

generate a histogram of signal amplitudes based on the collected signal data;

separate the predetermined frequency range into a plurality of frequency bins, said each frequency bin including a portion of the predetermined frequency range;

identify, for said each frequency bin, a minimum peak signal amplitude having a highest probability in the histogram;

follow a slope of bars of the histogram from the identified minimum peak signal amplitude to a minimum signal amplitude for said each frequency bin; and identify the minimum signal amplitudes for the frequency bins as the upper boundary of the background noise floor for the predetermined frequency range.

3. The test instrument of claim 1, the controller being further configured to:

compare a plurality of signal amplitudes in each signal trace of the plurality of signal traces to the upper boundary of the background noise floor;

calculate a plurality of average signal amplitudes across the predetermined frequency range based on the signal traces having signal amplitudes above the upper boundary of the background noise floor; and identify the plurality of average signal amplitudes as the carrier reference profile.

4. The test instrument of claim 1, the controller being configured to isolate the number of signal traces in the plurality of signal by:

cross-correlating each signal trace of the plurality of signal traces with the carrier reference profile;

comparing each cross-correlation to a predetermined threshold; and identifying said each signal trace as including a carrier when the cross-correlation associated exceeds the predetermined threshold.

5. The test instrument of claim 4, the controller being configured to isolate the number of signal traces in the plurality of signal traces by identifying a plurality of signal amplitudes present in the plurality of signal traces that are less than the upper boundary of the background noise floor.

6. The test instrument of claim 1, the controller being configured to collect the signal data from the cable network system by:

identifying at least one time period in which no carriers are present in an upstream band; and collecting, at the node, the signal data from the cable network system during the at least one identified time period.

7. The test instrument of claim 1, the controller being configured to collect signal data from the cable network system by:

locating configuration messages related to an upstream band in signal data received from the cable network system;

identifying at least one time period in which no carriers are present in the upstream band based on at least one configuration message; and collecting the signal data from the cable network system during at least one identified time period.

8. The test instrument of claim 7, the controller being configured to collect signal data from the cable network system by:

requesting an extended modem register period from the cable network system; and collecting signal data from the cable network system during the extended modem register period.

9. The test instrument of claim 1, further comprising a display operable to visually indicate intermittent noise present at the node.

10. The test instrument of claim 9, the controller being further configured to operate the display to provide a visual indication of a location of the intermittent noise.

11. The test instrument of claim 9, the controller being configured to operate the display to provide a first visual indicator when the location of the intermittent noise is downstream from the node and to provide a second visual indicator when the location of the intermittent noise is upstream from the node.

12. The test instrument of claim 1, the controller being further configured to:

identify an upper boundary of a background noise floor in the collected signal data across a predetermined frequency range of the cable network system; and isolate the number of signal traces in the plurality of signal traces based on the upper boundary of the background noise floor.

13. A cable network test instrument comprising:

a port configured to be coupled to a node of a cable network system, and a controller electrically connected to the port and being configured to communicate with the cable network system via the port, the controller including circuitry configured to:

request an extended modem register period from the cable network system;

collect signal data from the cable network system during the extended modem register period; and analyze the collected data to determine whether intermittent noise is present at the node.

14. The cable network test instrument of claim 13, wherein the port comprises a wireless transceiver operable to communicate wirelessly with the node of the cable network system.

15. The cable network test instrument of claim 13, wherein the controller further comprises circuitry configured to:

identify an upper boundary of a background noise floor in the collected signal data across a predetermined frequency range of the cable network system;

generate a plurality of signal traces based on the collected signal data;

isolate a number of signal traces in the plurality of signal traces based on the upper boundary of the background noise floor; and identify the intermittent noise present at the node based on the number of isolated signal traces.

16. The test instrument of claim 15, the controller further comprising circuitry configured to:

generate a histogram of signal amplitudes based on the collected signal data;

separate the predetermined frequency range into a plurality of frequency bins, said each frequency bin including a portion of the predetermined frequency range;

identify, for said each frequency bin, a minimum peak signal amplitude having a highest probability in the histogram;

follow a slope of bars of the histogram from the identified minimum peak signal amplitude to a minimum signal amplitude for said each frequency bin; and identify the minimum signal amplitudes for the frequency bins as the upper boundary of the background noise floor for the predetermined frequency range.

17. The test instrument of claim 15, the controller further comprising circuitry configured to:

compare a plurality of signal amplitudes in each signal trace of the plurality of signal traces to the upper boundary of the background noise floor;

calculate a plurality of average signal amplitudes across the predetermined frequency range based on the signal traces having signal amplitudes above the upper boundary of the background noise floor; and identify the plurality of average signal amplitudes as a carrier reference profile.

18. The test instrument of claim 17, the controller being configured to isolate the number of signal traces in the plurality of signal by:

cross-correlating each signal trace of the plurality of signal traces with the carrier reference profile;

comparing each cross-correlation to a predetermined threshold; and identifying said each signal trace as including a carrier when the cross-correlation associated exceeds the predetermined threshold.

19. The test instrument of claim 15, the controller being configured to isolate the number of signal traces in the plurality of signal traces by identifying a plurality of signal amplitudes present in the plurality of signal traces that are less than the upper boundary of the background noise floor.

20. The test instrument of claim 13, the controller being configured to operate a display to provide a first visual indicator when a location of the intermittent noise is downstream from the node and to provide a second visual indicator when the location of the intermittent noise is upstream from the node.

\* \* \* \* \*